(12) United States Patent
Cheng et al.

(10) Patent No.: US 11,605,799 B2
(45) Date of Patent: Mar. 14, 2023

(54) DISPLAY PANEL AND DISPLAY DEVICE

(71) Applicants: WUHAN TIANMA MICROELECTRONICS CO., LTD, Wuhan (CN); WUHAN TIANMA MICROELECTRONICS CO., LTD. SHANGHAI BRANCH, Shanghai (CN)

(72) Inventors: Lin Cheng, Shanghai (CN); Peng Zhang, Shanghai (CN); Xinzhao Liu, Shanghai (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 191 days.

(21) Appl. No.: 17/236,281

(22) Filed: Apr. 21, 2021

(65) Prior Publication Data
US 2021/0242426 A1   Aug. 5, 2021

(30) Foreign Application Priority Data

Dec. 30, 2020 (CN) .......................... 202011614895.X

(51) Int. Cl.
*H01L 27/32* (2006.01)
*H01L 51/00* (2006.01)
*H01L 51/52* (2006.01)

(52) U.S. Cl.
CPC ...... *H01L 51/5253* (2013.01); *H01L 27/3276* (2013.01); *H01L 51/0097* (2013.01); *H01L 51/5281* (2013.01)

(58) Field of Classification Search
CPC ............. H01L 51/5253; H01L 27/3276; H01L 51/0097; H01L 51/5281; H01L 27/3244; Y02E 10/549
See application file for complete search history.

(56) References Cited

U.S. PATENT DOCUMENTS

2018/0062090 A1* 3/2018 Kim .................... H01L 51/5253

FOREIGN PATENT DOCUMENTS

| CN | 205594260 U | 9/2016 |
| CN | 110224081 A | 9/2019 |

* cited by examiner

*Primary Examiner* — Kyoung Lee
(74) *Attorney, Agent, or Firm* — von Briesen & Roper, s.c.

(57) ABSTRACT

Provided are a display panel and a display device. The display panel includes a display area, a non-display area and a polarizer. The non-display area includes a fan-out area and a bonding area arranged in a direction facing away from the display area. The fan-out area includes a first section and a second section. The second section is a bending area. The first section, the second section and the bonding area are arranged in a first direction. A side of the polarizer facing towards the fan-out area is provided with multiple first openings. The bending area and the bonding area are covered with a protective glue which further extends to an edge of the polarizer in the first section.

18 Claims, 9 Drawing Sheets

DISPLAY PANEL AND DISPLAY DEVICE

CROSS-REFERENCE TO RELATED APPLICATION

This application claims priority to Chinese Patent Application No. 202011614895.X filed Dec. 30, 2020, the disclosure of which is incorporated herein by reference in its entirety.

TECHNICAL FIELD

The present disclosure relates to the field of display technologies and, in particular, to a display panel and a display device.

BACKGROUND

With the development of display technologies, the design of a high screen-to-body ratio display panels has gradually become a research hotspot.

For the organic light-emitting display panels, in the existing art, a bonding area is bent to a non-display surface of the display panel to achieve a narrow bezel, thereby increasing the area of the display area, and achieving a high screen-to-body ratio. In addition, to protect traces in the bezel area and the bending portion, generally, the protective glue is provided above the bezel area and the bending portion from the edge of the polarizer.

However, in a case where the bezel area is relatively narrow, the protective glue has a relatively thin thickness at a bending starting point, which easily leads to the problem of trace breakage during the bending process.

SUMMARY

The present disclosure provides a display panel and a display device to reduce the risk of trace breakage while achieving a narrow bezel.

In a first aspect, the present disclosure provides a display panel. The display panel includes a display area and a non-display area.

The non-display area includes a fan-out area and a bonding area arranged in a direction facing away from the display area; the fan-out area includes a first section and a second section; the second section is a bending area; and the first section, the second section and the bonding area are arranged in a first direction.

The display panel further includes a polarizer. A side of the polarizer facing towards the fan-out area is provided with multiple first openings. The bending area and the bonding area are covered with a protective glue which extends to an edge of the polarizer in the first section.

In a second aspect, the present disclosure provides a display device. The display device includes a display panel and the display panel includes a display area and a non-display area. The non-display area includes a fan-out area and a bonding area arranged in a direction facing away from the display area; the fan-out area includes a first section and a second section; the second section is a bending area; and the first section, the second section and the bonding area are arranged in a first direction. The display panel further includes a polarizer. A side of the polarizer facing towards the fan-out area is provided with multiple first openings. The bending area and the bonding area are covered with a protective glue which extends to an edge of the polarizer in the first section.

DETAILED DESCRIPTION

Figure 1:
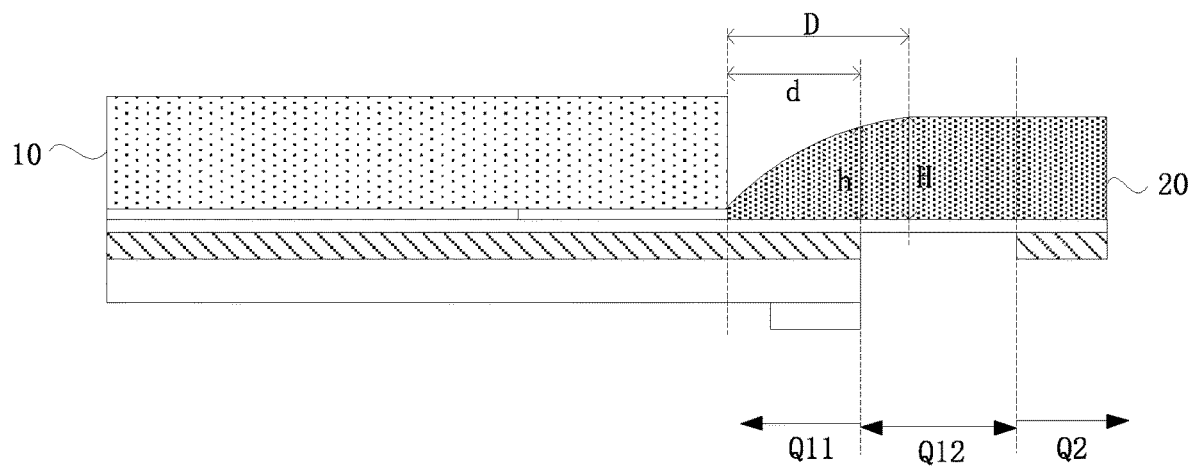
FIG. 1 is a structural view of a display panel in the existing art.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Exemplarily, FIG. 1 is a structural view of a display panel in the existing art. Referring to FIG. 1, a polarizer 10 is provided on a light-outgoing side of the display panel. From an edge of the polarizer 10, a protective glue 20 is provided above a bezel area 51, a bending area S2, and a bonding area S3 of the display panel. The protective glue 20 is in contact with the edge of the polarizer 10 (not shown in FIG. 1) for protecting a structure such as traces extending from the display area to the bonding area.

Since the protective glue is liquid, the protective glue reaches a stable thickness H after a climbing width D. However, as shown in FIG. 1, to achieve a narrow bezel, a length d of a step is usually smaller than the climbing width D, making the thickness of the protective glue at a starting point of the bending area h thickness (h<H), which cannot play a good protective role for the structure such as the traces, and easily causes the problem of trace breakage during the bending process. To solve this problem, the embodiment of the present disclosure adopts the solutions described below.

Figure 2:
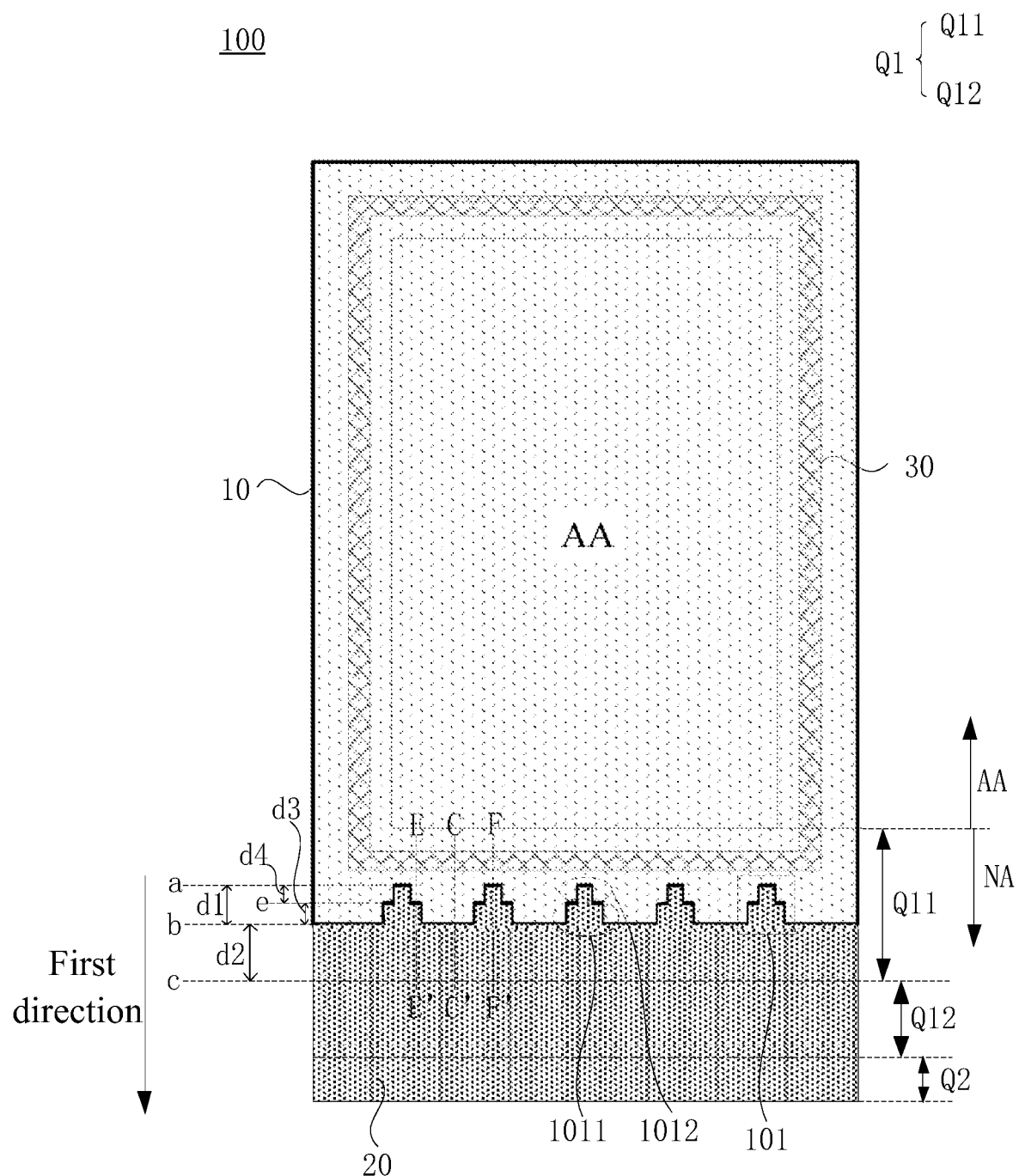
FIG. 2 is a structural view of a display panel provided by an embodiment of the present disclosure.
Figure 3:
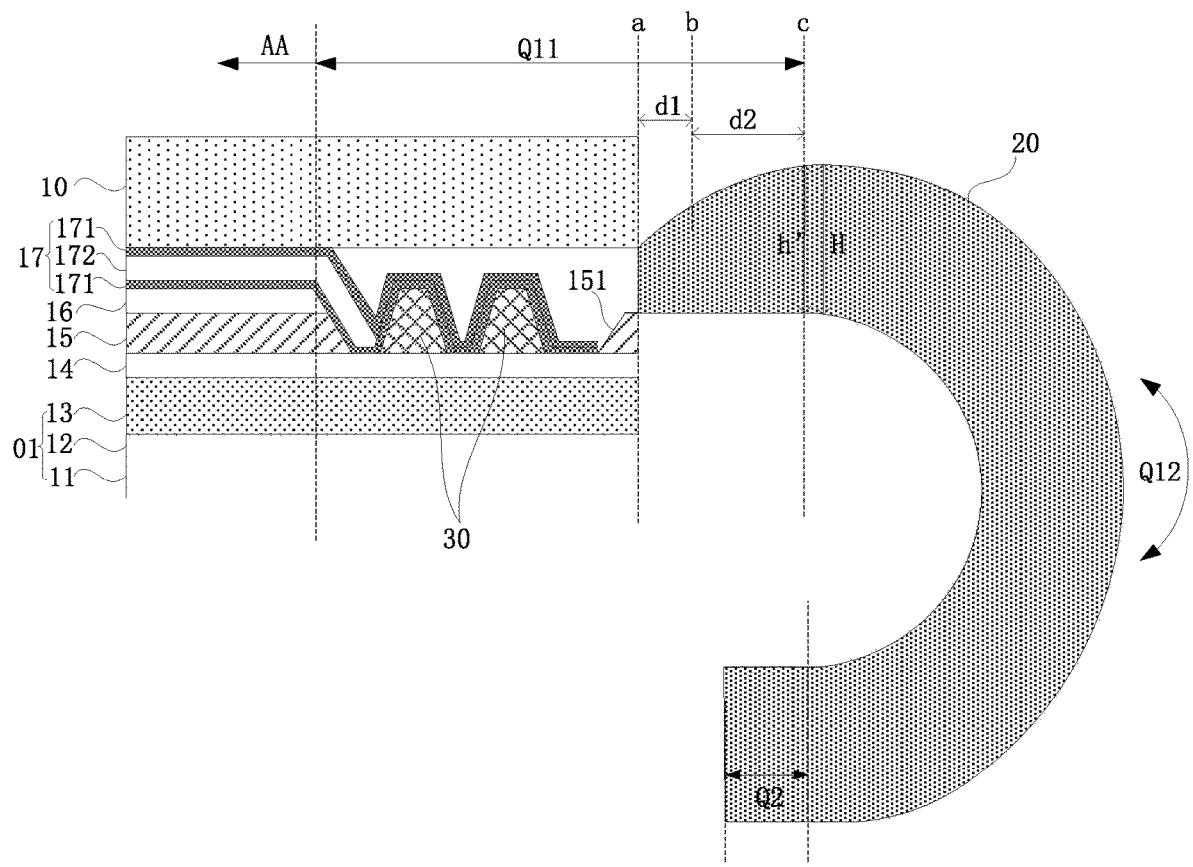
FIG. 3 is a sectional view of a display panel taken along line BB' in FIG. 2.

FIG. 2 is a structural view of a display panel provided by an embodiment of the present disclosure. FIG. 3 is a sectional view of a display panel taken along a straight line on which BB' is located in FIG. 2. Referring to FIGS. 2 and 3, a display panel 100 provided by an embodiment of the present disclosure includes a display area AA and a non-display area NA. The display panel 100 also includes a polarizer 10. The non-display area NA includes a fan-out area Q1 and a bonding area Q2 arranged in a direction facing away from the display area AA. The fan-out area Q1 includes a first section Q11 and a second section Q12. The second section Q12 is a bending area. The first section Q11, the second section Q12 and the bonding area Q2 are arranged in a first direction. A side of the polarizer 10 facing towards the fan-out area Q1 is provided with multiple first openings 101. The bending area and the bonding area Q2 are covered with a protective glue 20 which further extends to an edge 10 of the polarizer in the first section Q11.

It can be seen from FIGS. 2 and 3, the polarizer 10 covers the display area AA and part of the non-display area NA. In addition to resisting the interference of ambient light on the display brightness and contrast of the display area AA, the polarizer 10 can also play a role in protecting the underlying film. The remaining part of the non-display area NA, i.e., the second section Q12, the bonding area Q2, and the part of the first section Q11 not covered by the polarizer 10, can be protected by the protective glue 20. Exemplarily, the protective glue 20 may be a UV glue, and after the protective glue 20 is cured, the bonding area Q2 can be bent to a non-display side of the display panel by bending the second area Q12 to achieve a narrow bezel.

As shown in FIGS. 2 and 3, a dispensing starting point of the protective glue 20 is the edge of the polarizer 10 facing towards the fan-out area Q1. In this embodiment, the dispensing starting point of part of the protective glue 20 is the edge (e.g., an edge b) of the polarizer 10 where no first opening 101 is provided, and the dispensing starting point of part of the protective glue 20 is the edge (e.g., an edge a) of the polarizer 10 where no first opening 101 is provided.

Exemplarily, FIG. 3 illustrates a structure of the protective glue 20 at a position where the first opening 101 is located. It can be seen from FIGS. 2 and 3 that the protective glue 20 at the position where the first opening 101 is located starts to climb from the edge a of the polarizer 10. On the premise of not considering the protective glue 20 at the position where no first opening 101 is provided, since edge a is farther away from the bending area, the protective glue 20 has a relatively long distance for climbing, thereby increasing the thickness of the protective glue 20 at the starting point (i.e., a boundary c) of the bending area. It can be further understood that since the protective glue 20 has fluidity, the thicknesses of the protective glue 20 at various positions are basically the same. Compared with the existing art, in this solution, the first openings 101 can accommodate a part of the protective glue 20, thereby increasing the thickness of the protective glue 20 at the starting point of the bending area and reducing the risk of trace breakage during the bending process.

Moreover, the first openings 101 are disposed at the edge of the polarizer 10, so that the contact area between the polarizer 10 and the protective glue 20 is increased and the protective glue 20 is more firmly bonded to the polarizer 10, preventing a side of the protective glue 20 facing towards the polarizer 10 from being tilted during the bending process, and improving the quality of the display panel.

Figure 4:
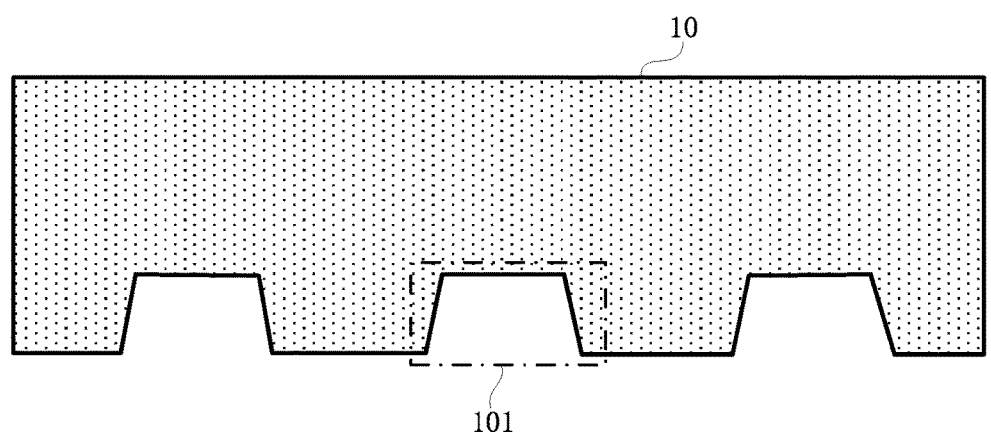
FIG. 4 is a partial structural view of a polarizer provided by an embodiment of the present disclosure.

It is to be understood that FIG. 1 schematically illustrates an example in which the first openings 101 are rectangular. Exemplarily, FIG. 4 is a partial structural view of a polarizer provided by an embodiment of the present disclosure. Referring to FIG. 4, each first opening 101 may also be a trapezoid, and those skilled in the art can design the shape of each first opening 101 according to requirements, which is not limited by the embodiment of the present disclosure.

In the embodiment of the present disclosure, the side of the polarizer facing towards the fan-out area Q1 is provided with multiple first openings so that the climbing starting point (the dispensing starting point) of part of the protective glue is farther away from the bending area and the first openings can be used for accommodating a part of the protective glue. In this way, in the case where the display panel has the same narrow bezel as the display panel in the existing art, since the protective glue has fluidity, in this solution, the thickness of the protective glue corresponding to a starting point (i.e., a juncture of a first section Q11 and a second section Q12) of the bending area is increased, so that the protective glue can play a good protective role for the film under the protective glue, and the risk of trace breakage during the bending process is reduced.

Based on the above embodiment, the configuration of the first openings 101 in the polarizer 10 is further described below in detail.

Further referring to FIG. 2, optionally, a distance L between any two adjacent first openings 101 is equal.

As can be seen in FIG. 2, the climbing starting point (i.e., the boundary c) of the protective glue at the position of the first opening 101 is farther away from the starting point of the bending area than the climbing starting point of the protective glue at the position where no first opening 101 is provided on the polarizer. Therefore, from the edge (i.e., the edge b) of the polarizer where no first opening 101 is provided, the protective glue in an area corresponding to the first opening 101 flows to an area where no first opening 101 is provided on two sides, thereby increasing the overall thickness of the protective glue, so that the thickness of the protective glue at the starting point (i.e., the boundary c) of the bending area reaches a requirement.

It is to be understood that the protective glue has a relatively small fluidity. If the distance between two adjacent ones of the multiple first openings on the polarizer is different, the thickness of the protective glue from the edge of the polarizer to the starting point of the bending area is uneven, which may cause the thickness of the protective glue in a partial area at the starting point (i.e., the boundary C) of the bending area to be thin and lead to the problem that the structure such as the traces under this area cannot be effectively protected during the bending process.

In this embodiment, the distance L between any two adjacent first openings 101 is provided to be equal so that the first openings 101 can be uniformly distributed at the edge of the polarizer facing towards the fan-out area Q1. In this way, the thicknesses of the protective glue at respective positions at the starting point of the bending area can be basically the same and can all meet the thickness requirement, and thus the protective glue plays a good protective role for the film under the protective glue during the bending process, and the risk of trace breakage during the bending process is reduced.

Further referring to FIG. 2, in the first direction, each first opening 101 may have a maximum length of D1. A distance between the edge (the edge b) where no first opening 101 is provided on a side of the polarizer 10 facing towards the fan-out area Q1 and a boundary (the boundary c) between the first section Q11 and the second section Q12 is d2. d1+d2≥D, and D is a climbing length of the protective glue 20.

As described above, the thickness of the protective glue 20 reaches H after the climbing length D. As shown in FIG. 3, in this embodiment, d1+d2≥d is configured so that a thickness h' of the protective glue 20 at the starting point (the boundary c) of the bending area can be made close to (or even equal to) H, thereby reducing the risk of trace breakage.

Specifically, in a case where d1+d2=D, the thickness h' of the protective glue 20 at the starting point (the boundary c) of the bending area satisfies h<h'<H where h is the thickness of the protective glue 20 at the starting point of the bending area in a case where the polarizer is not provided with the first opening in the existing art (referring to FIG. 1). In a case where (d1+d2) exceeds D by a certain value, the thickness h' of the protective glue 20 at the starting point (the boundary c) of the bending area reaches H.

However, as described above, the polarizer 10 can protect the film under the polarizer to some degree. If the edge (i.e., the edge a) of the first opening 101 is too close to the display area AA, the quality of the display panel can be adversely affected. The first opening 101 can be designed in the following manners to avoid affecting the quality of the display panel.

Referring to FIGS. 2 and 3, the display panel further may include a baffle wall structure 30 located in the non-display area NA. The baffle wall structure 30 is disposed around the display area AA. The edge of the first opening 101 is located on a side of the baffle wall structure 30 facing away from the display area AA.

The baffle wall structure 30 is disposed around the display area AA, and a drive circuit (such as a scanning drive circuit) and traces are usually provided in the non-display area NA between the baffle wall structure 30 and the display area AA. Thus, in this embodiment, the edge of the first opening 101 is provided to be located on the side of the baffle wall structure 30 facing away from the display area AA so that the polarizer 10 covers the baffle wall structure 30, thereby protecting the drive circuit and the traces, and maintaining the quality of the display panel.

Further referring to FIGS. 2 and 3, the display panel may further include a substrate 01 and a pixel circuit layer 14, an organic planarization layer 15, a light emitting element layer 16 and an encapsulation layer 17 sequentially located on the substrate 01. The polarizer 10 is located on a side of the encapsulation layer 17 facing away from the substrate 01. The organic planarization layer 15 in the first section Q11 of the fan-out area Q1 is provided with a second opening 151. The display panel further includes a baffle wall structure 30. The baffle wall structure 30 is located between the encapsulation layer 17 and the pixel circuit layer 14, and the baffle wall structure 30 is located in the second opening 151. An edge of the first opening 101 is located on a side of the second opening 151 facing away from the display area AA.

As shown in FIG. 3, the encapsulation layer 17 may be formed by stacking multiple inorganic encapsulation layers 171 and an organic encapsulation layer 172. The organic planarization layer 15 is provided with the second opening 151 and the baffle wall structure 30 is disposed within the second opening 151, so that the baffle wall structure 30 can be used for blocking the organic encapsulation layer 172 in the encapsulation layer 17, and the inorganic encapsulation layer 171 in the encapsulation layer 17 is in contact with the insulating layer (which is usually an inorganic material) in the pixel circuit layer 14, thereby achieving better sealing performance, preventing the water vapor from entering the light emitting element layer, improving the performance of the light emitting element layer, and enhancing the display effect.

The organic planarization layer 15 is usually thick, and is used for protecting the structure such as traces in the pixel circuit layer 14, and preventing the traces from fracturing due to an external force, while the traces under the second opening 151 are not protected by the organic planarization layer 15. In this case, if the second opening 151 is exposed from the first opening 101, the protection degree for the traces under the second opening 151 is further reduced, easily causing the problem of trace breakage. Therefore, in the embodiment of the present disclosure, the edge of each first opening 101 is located on the side of the second opening 151 facing away from the display area AA so that the polarizer 10 covers the second opening 151 to protect the traces under the second opening 151 with the polarizer 10, and reducing the risk of the trace fracture under the second opening 151.

Figure 5:
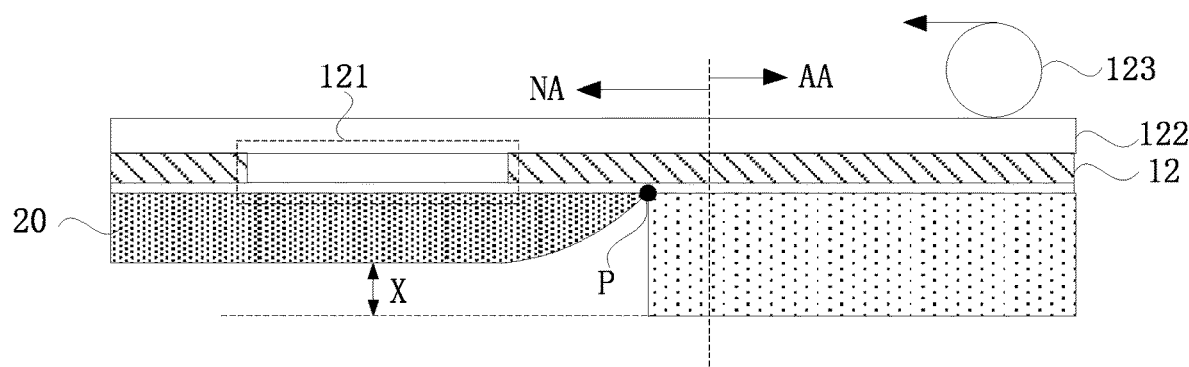
FIG. 5 is a schematic view of a design of a first opening in a polarizer.
Figure 6:
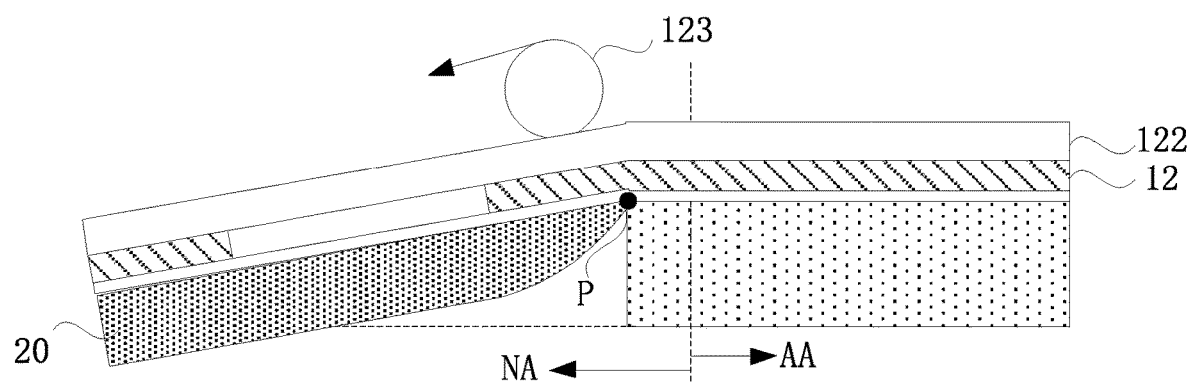
FIG. 6 is a schematic view of a design of a first opening in a polarizer

Exemplarily, FIGS. 5 and 6 are schematic views of a design of a first opening in a polarizer. The design principle that the edge of each first opening 101 is located on the side of the second opening 151 facing away from the display area AA is further explained by using FIGS. 3, 5 and 6 as examples.

Referring to FIGS. 3 and 5, the display panel includes the substrate 01 including a buffer base material layer 11, a lower adhesive film 12, and a flexible base material 13 layer which are sequentially laminated. The lower adhesive film 12 is provided with a third opening in the bending area 121. The flexible base material layer 13 is located on a side of the lower adhesive film 12 facing towards the polarizer 10. The flexible substrate layer 13 may be made of a PI material having a good bending property. The buffer base material layer 11 may be a tape. After the second section Q12 is bent, the lower adhesive film 12 is adhered to the buffer base material layer 11. Further, the third opening 121 is disposed at a position of the lower adhesive film 12 (LAMI) corresponding to the bending area, which facilitates bending of the second section Q12 and bending the bonding area Q2 to a non-light-outgoing side of the display panel.

Specifically, as shown in FIGS. 5 and 6, a protective film 122 is adhered to a side of the lower adhesive film 12 facing away from the polarizer 10. During the preparation process of the display panel, after the preparation of the structure from the flexible substrate layer 13 to the polarizer 10 side is completed, the protective film 122 of the lower adhesive film 12 may be removed by a roller 123, and the buffer substrate layer 11 is formed on the side of the lower adhesive film 12 facing away from the polarizer 10. Then, the bonding area Q2 can be bent to the non-light-outgoing side of the display panel.

It can be seen from FIGS. 5 and 6, there is a gap X between the protective glue 20 and the polarizer 10. In a case where the roller 123 rolls to a side of the protective glue 20, the protective glue 20 inclines downward, causing a position where the protective glue 20 contacts the polarizer 10 (i.e., the edge of the polarizer, such as a position P) to be a stress concentration point. In this case, if the second opening 151 of the organic planarization layer 15 is exposed from the first opening 101 of the polarizer 10, since the traces under the second opening 151 are only protected by the inorganic encapsulation layer 171, the problem of the trace fracture under the second opening 151 is easily to occur, affecting the quality of the display panel. In this embodiment, the edge of the first opening 101 is disposed on the side of the second opening 151 facing away from the display area AA. In this way, on one hand, the polarizer 10 can be used to protect the structure below the second opening 151; and on the other hand, since the edge of the first opening 101 (i.e., the edge a in FIG. 3) is correspondingly provided with the organic planarization layer 15, the organic planarization layer 15 can also provide good protection for the lower traces even if this edge position is a stress concentration point, thereby ensuring the quality of the display panel.

Figure 7:
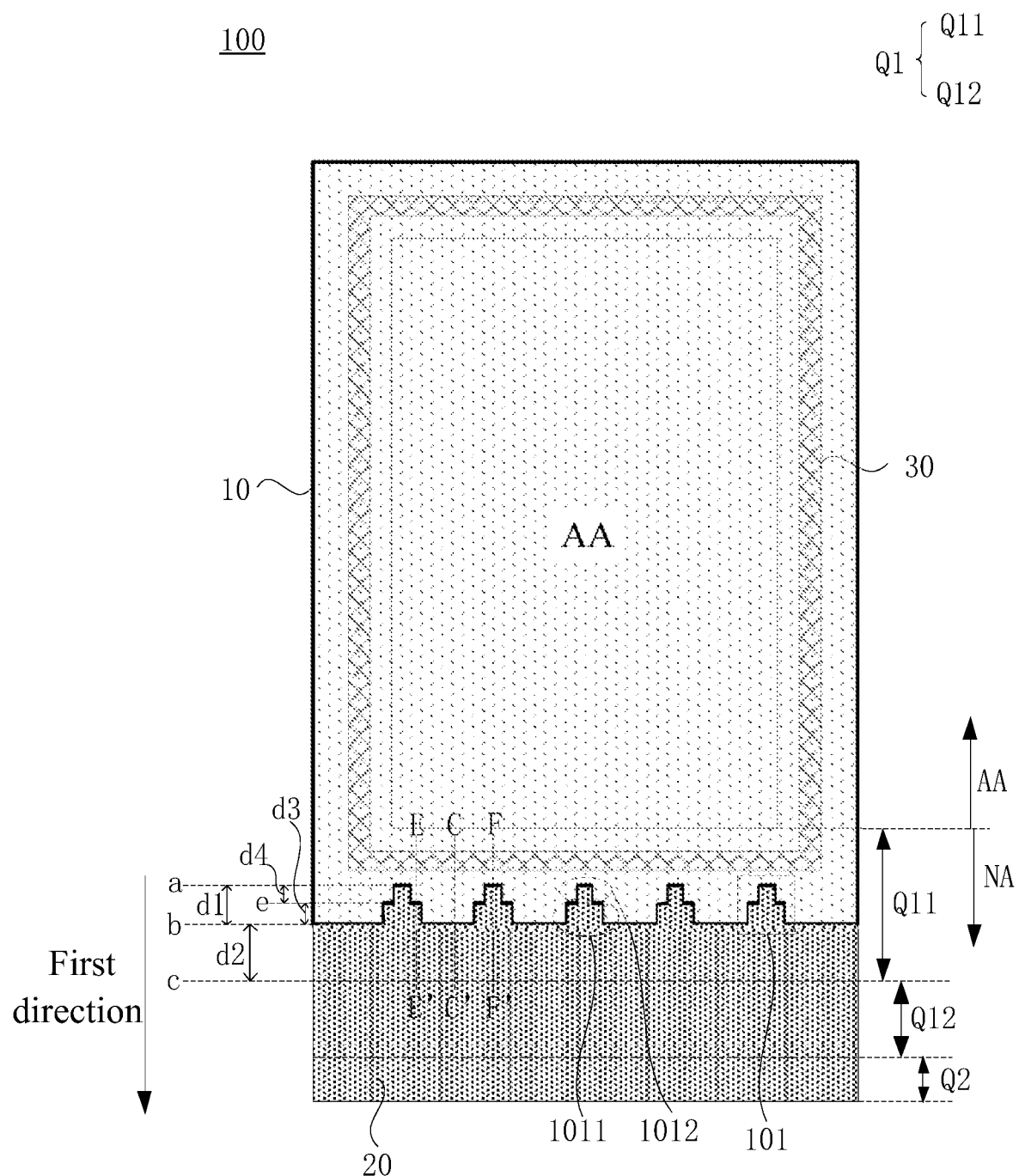
FIG. 7 is a structural view of another display panel provided by an embodiment of the present disclosure.

FIG. 7 is a structural view of another display panel provided by an embodiment of the present disclosure. Referring to FIG. 7, optionally, at least part of the multiple first openings 101 each includes a first opening sub-section 1011 and a second opening sub-section 1012. The second opening sub-section 1012 is communicated with the first opening sub-section 1011. The second opening sub-section 1012 is located on a side of the first opening sub-section 1011 facing towards the display area AA. In a direction parallel to the display panel and perpendicular to the first direction, a length of the first opening sub-section 1011 is larger than a length of the second opening sub-section 1012.

Exemplarily, the first opening 101 may be configured as a rectangular opening or a trapezoid opening as shown in FIG. 2 or 4, and the first opening 101 may also be formed by multiple interconnected opening sub-sections disposed in the first direction, referring to FIG. 7. Those skilled in the art can configure the first opening according to actual requirements, which is not limited by the embodiments of the present disclosure.

In a case where the polarizer 10 is provided with the first openings 101 with the baffle wall structure 30 or the second opening 151 exposed, the protection degree for the structure such as the drive circuit and the traces is further reduced. It is to be understood that in the direction perpendicular to the first direction, the longer the length of the first opening 101, the more unfavorable it is to protect the structure such as the drive circuit and the traces. In this embodiment, since the second opening sub-section 1012 is closer to the display area AA than the first opening sub-section 1011, a length of the second opening sub-section 1012 in the direction perpendicular to the first direction is provided to be less than a length of the first opening sub-section 1011 in the direction perpendicular to the first direction so that the protection for the structure such as the drive circuit and the traces can be improved to a certain extent.

In addition, to avoid the case of trace breakage caused by configuring the first opening 101 on the polarizer 10, traces may be disposed in a corresponding area of the polarizer 10 where no first opening 101 is provided. In this case, if the length of the first opening 101 in the direction perpendicular to the first direction is relatively long, the area for disposing the traces is greatly reduced, which is disadvantageous for arranging a large number of traces in the fan-out area. In this embodiment, the length of the second opening sub-section 1012 in the direction perpendicular to the first direction is provided to be less than the length of the first opening sub-section 1011 in the direction perpendicular to the first direction, and an edge (i.e., an edge a) of the second opening sub-section 1012 may be disposed as close as possible to the display area AA to ensure the thickness of the protective glue at the starting point (i.e., a boundary c) of the bending area to reach H. Meanwhile, an edge (i.e., an edge e) of the first opening sub-section 1011 may be disposed as far away as possible from the display area AA. In this way, an area corresponding to the edge (i.e., the edge e) of the first opening sub-section 1011 may also be provided with the traces, thereby ensuring a sufficient area for disposing the traces.

Referring to FIG. 7, in the first direction, a length d3 of the first opening sub-section 1011 and a length d4 of the second opening sub-section 1012 may satisfy d3+d4=d1. d1 is the longest length of the first opening 101 described above, so that d3+d4+d2≥D, and the thickness of the protective glue 20 at the starting point (the boundary C) of the bending area is close to or equal to H, thereby reducing the risk of trace breakage during the bending process.

Figure 8:
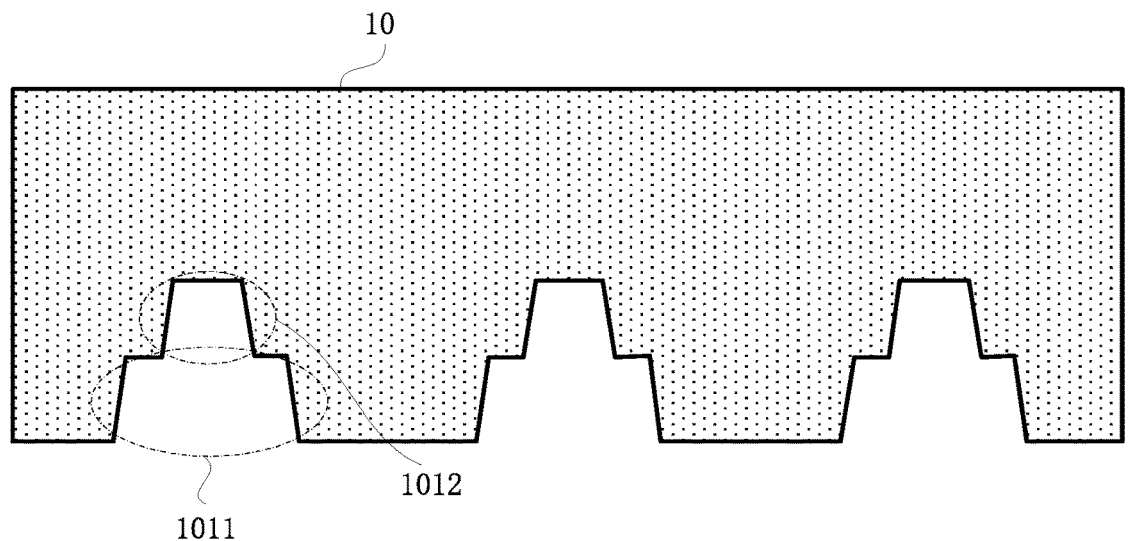
FIG. 8 is a partial structural view of another polarizer provided by an embodiment of the present disclosure.

Exemplarily, FIG. 7 schematically illustrates an example in which both the first opening sub-section 1011 and the second opening sub-section 1012 are rectangular. In other embodiments, the first opening sub-section 1011 or the second opening sub-section 1012 may be rectangular. In addition, referring to FIG. 8, FIG. 8 is a partial structural view of another polarizer provided by an embodiment of the present disclosure. At least one of the first opening sub-section 1011 or the second opening sub-section 1012 may be trapezoid, which can be configured by those skilled in the art according to actual requirements, and is not limited by the embodiments of the present disclosure. FIG. 8 schematically illustrates an example in which both the first opening sub-section 1011 and the second opening sub-section 1012 are trapezoid. It is to be noted that the first opening 101, the first sub-opening, and the second sub-opening may be in any other shape, and only a rectangle and a trapezoid are used as examples for illustration.

Figure 9:
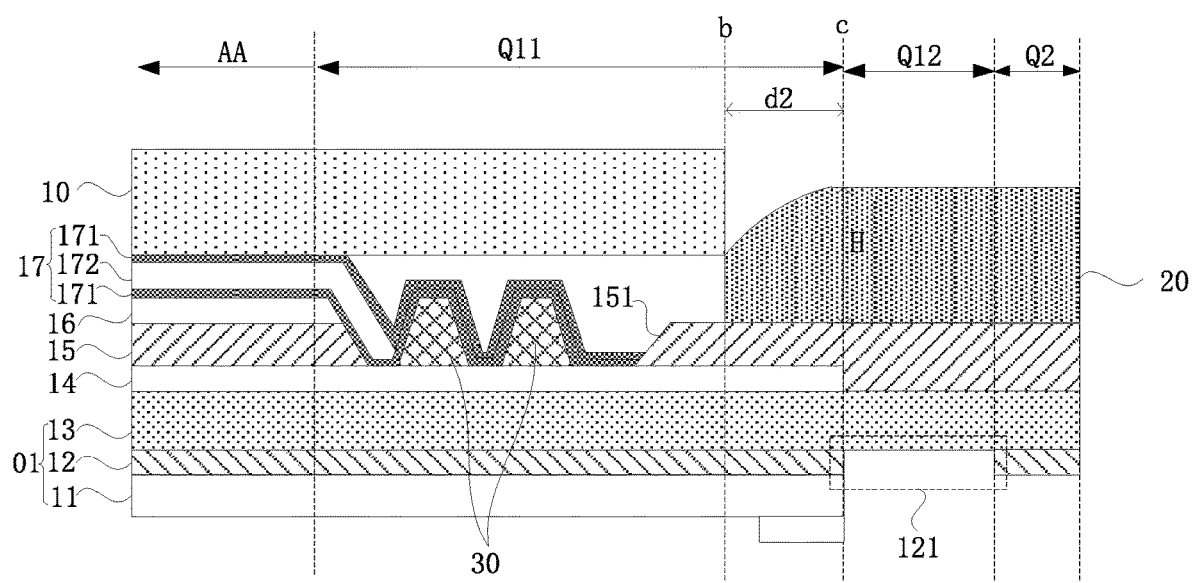
FIG. 9 is a sectional view of a display panel taken along line CC' in FIG. 7.
Figure 10:
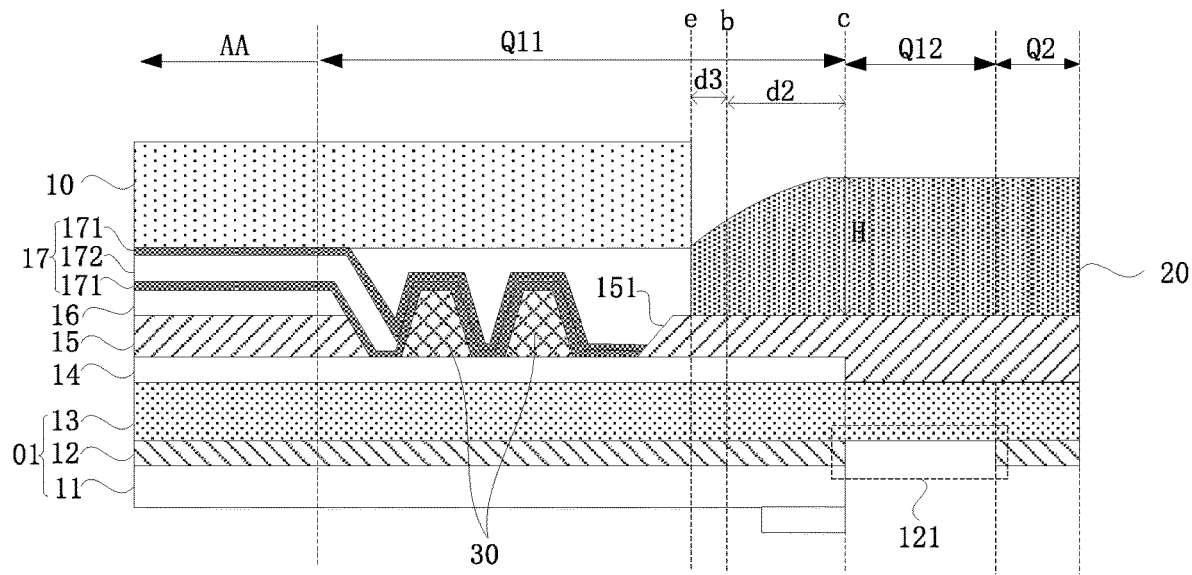
FIG. 10 is a sectional view of a display panel taken along line EE' in FIG. 7.
Figure 11:
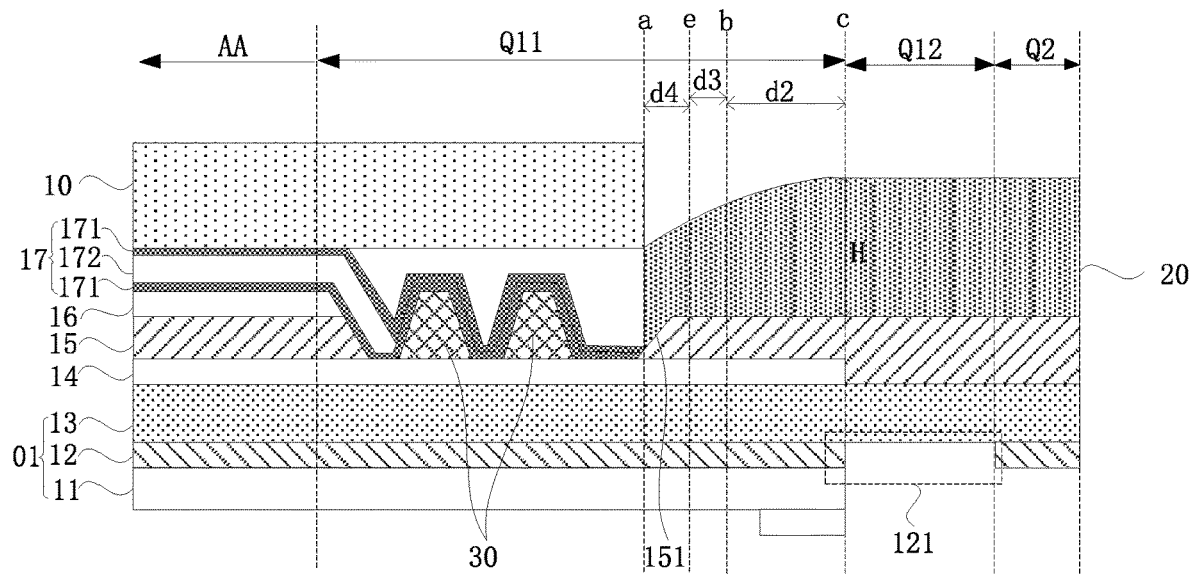
FIG. 11 is a sectional view of a display panel taken along line FF' in FIG. 7.

Exemplarily, FIG. 9 is a sectional view of the display panel taken along line CC' in FIG. 7. FIG. 10 is a sectional view of a display panel taken along line EE' in FIG. 7. FIG. 11 is a sectional view of a display panel taken along line FF' in FIG. 7. Referring to FIGS. 9, 10 and 11, the display panel may further include a substrate 01, and a pixel circuit layer 14, an organic planarization layer 15, a light emitting element layer 16 and an encapsulation layer 17 sequentially located on the substrate 01. The polarizer 10 is located on a side of the encapsulation layer 17 facing away from the substrate 01. The organic planarization layer 15 is provided with a second opening 151 in the first section Q11 of the fan-out area Q1. The display panel further includes a baffle wall structure 30. The baffle wall structure 30 is located between the encapsulation layer 17 and the pixel circuit layer 14, and the baffle wall structure 30 is located in the second opening 151. An edge (i.e., the edge e) of the first opening sub-section 1011 is located at a side (FIG. 10) of the second opening 151 facing away from the display area AA. An edge (i.e., the edge a) of the second opening sub-section 1012 is located on a side (FIG. 11) of the baffle wall structure 30 facing away from the display area.

FIG. 9 illustrates a structure of the protective glue 20 at the position of the polarizer 10 where no first opening 101 is provided. It can be seen from FIG. 9 that, at this position, a climbing starting point of the protective glue 20 is the edge (i.e., an edge b) of the polarizer 10 where no first opening 101 is provided. FIG. 10 illustrates a structure of the protective glue 20 at the position of the polarizer 10 where the first opening sub-section 1011 is provided, and it can be seen from FIG. 10 that at this position, the climbing starting point of the protective glue 20 is the edge (i.e., the edge e) of the first opening sub-section 1011. FIG. 11 illustrates a structure of the protective glue 20 at the position of the polarizer 10 where the second opening sub-section 1012 is provided. It can be seen from FIG. 11 that the climbing starting point of the protective glue 20 is the edge (i.e., the edge a) of the second opening sub-section 1012. It can be seen from FIGS. 9 to 11 that the first openings 101 shown in FIG. 7 are disposed on a side of the polarizer 10 facing towards the fan-out area Q1 so that the thickness of the protective glue 20 at the starting point (i.e., the boundary c) of the bending area can be increased to reach H, thereby reducing the risk of fracture of the traces under the protective glue 20 during the bending process.

In addition, referring to FIG. 10, in this embodiment, the edge (i.e., the edge e) of the first opening sub-section 1011 is provided to be located on a side of the second opening 151 facing away from the display area AA so that the polarizer 10 corresponding to the edge of the first opening sub-section 1011 may cover the second opening 151, thereby providing the good protection for the traces under the second opening 151.

For the second opening sub-section 1012, that the edge (the edge a) of the second opening sub-section 1012 is located on the side of the baffle wall structure 30 facing away from the display area AA described above may include: the edge (i.e., the edge a) of the second opening sub-section 1012 is located on the side of the second opening 151 facing away from the display area AA in the organic planarization layer 15, or the edge of the second opening sub-section 1012 is located on the side of the baffle wall structure 30 facing away from the display area AA and overlaps the second opening 151 in a direction perpendicular to the display panel, which can be configured by those skilled in the art according to requirements and is not limited by the embodiments of the present disclosure.

Specifically, in the case where the edge of the second opening sub-section 1012 (i.e., the edge a) is located on the side of the second opening 151 in the organic planarization layer 15 facing away from the display area AA, the polarizer 10 can cover the baffle wall structure 30 and the second opening 151 in the organic planarization layer 15, thereby providing good protection for the structure such as the traces under the second opening 151 and ensuring the quality of the display panel. In the case where the edge of the second opening sub-section 1012 is located on the side of the baffle wall structure 30 facing away from the display area AA and overlaps the second opening 151 in a direction perpendicular to the display panel, the length of the first opening 101 along the first direction is further increased so that the first opening 101 can accommodate more protective glue 20, and then the thickness of the protective glue 20 at the starting point (i.e., the boundary c) of the bending area reaches H, which can provide good protection for the traces under the protective glue 20, and reduce the risk of trace breakage during the bending process.

Exemplarily, FIG. 11 schematically illustrates an example in which the edge of the second opening sub-section 1012 is located on the side of the baffle wall structure 30 facing away from the display area AA and overlaps the second opening 151 in a direction perpendicular to the display panel. It can be seen from FIG. 11 that since part of the second opening 151 is exposed from the second opening sub-section 1012, the protective glue 20 located in the second opening sub-section 1012 can be filled in the second opening 151 so that the first opening 101 can accommodate more protective glue 20. Thus, during the dispensing process, due to the fluidity of the protective glue 20, the thickness of the protective glue 20 at the starting point (i.e., the boundary c) of the bending area can reach H (referring to FIGS. 9 to 11).

In summary, the shape of each first opening 101 and the position where the edge of each first opening 101 is located in the polarizer 10 are described in detail in the above embodiments. Based on the above description, it can be understood that, in addition to the thickness of the protective glue 20 at the starting point of the bending area affecting the protection degree for the traces under the protective glue 20 during the bending process, if the edge of the first opening 101 in the polarizer 10 is disposed at different positions, the protection degree for the traces in an area where the first section Q11 is located in the fan-out area Q1 is also different. Specifically, if the traces in the area where the first section Q11 is located are protected by at least one of the organic planarization layer 15 or the polarizer 10, the protection degree is relatively high, and the risk of trace breakage in this area during the preparation process of the display panel is relatively low. If the traces in the area where the first section Q11 is located are neither protected by the organic planarization layer 15 nor protected by the polarizer 10, the protection degree is relatively low, and the risk of trace breakage in this area during the preparation of the display panel is relatively high. Therefore, the configuration of the traces in the first section Q11 is described in detail below with reference to the configuration of the first opening 101.

Figure 12:
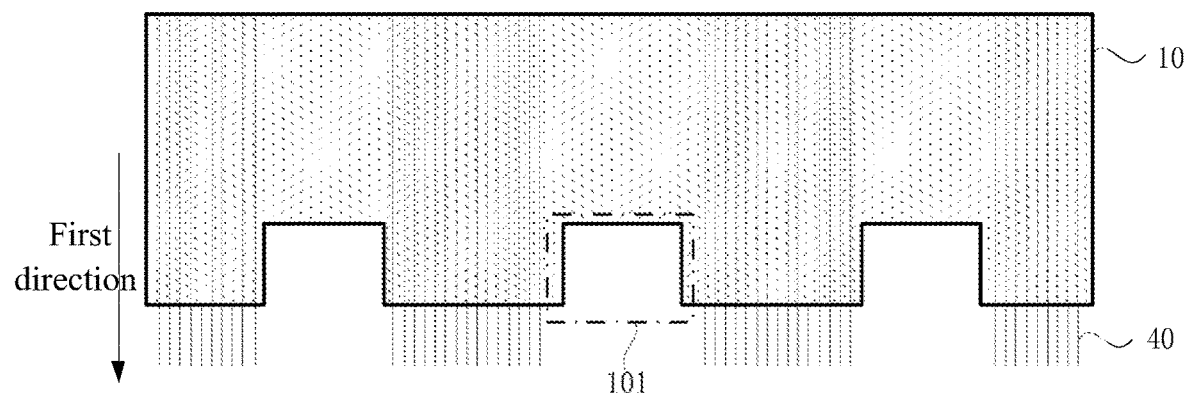
FIG. 12 is a partial structural view of a display panel provided by an embodiment of the present disclosure.

FIG. 12 is a partial structural view of a display panel provided by an embodiment of the present disclosure. Referring to FIG. 12, the first section Q11 may be further provided with multiple signal lines 40. A vertical projection of each signal line 40 on the polarizer 10 does not overlap the first opening 101.

As described above, the traces under the second opening 151 in the organic planarization layer 15 are easily broken due to stress. Referring to FIG. 9, since the area of the polarizer 10 where no first opening 101 is provided covers the second opening 151 in the organic planarization layer 15, in this embodiment, the signal lines 40 are correspondingly disposed in the area of the polarizer 10 where no first opening 101 is provided, so that it can be ensured that the signal lines 40 under the second opening 151 are protected by the polarizer 10. Meanwhile, the signal lines 40 corresponding to the edge (i.e., the edge b) of the polarizer 10 where no first opening 101 is provided are protected by the organic planarization layer 15. In this way, during the attaching process of the lower adhesive film 12 (referring to FIGS. 5 and 6), even if the edge b is a stress concentration point, the organic planarization layer 15 can also effectively protect the signal lines 40, thereby effectively reducing the risk of breaking of the signal lines 40 during the preparation process of the display panel.

In addition, in this embodiment, since the signal lines 40 are not disposed at the position where the first opening 101 is located, a requirement on the position where the edge of the first opening 101 is located can be reduced to ensure that the thickness of the protective glue 20 at the starting point (i.e., the boundary C) of the bending area reaches H, and the risk of trace breakage during the bending process is reduced.

Figure 13:
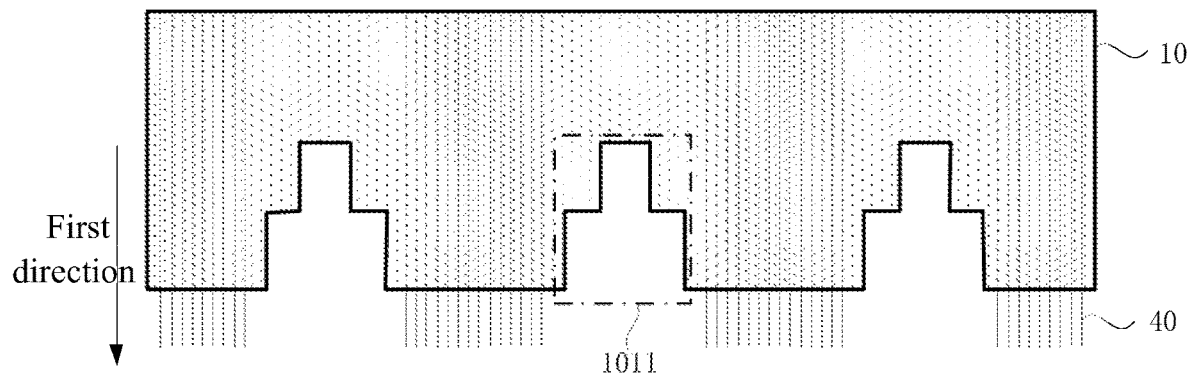
FIG. 13 is a partial structural view of another display panel provided by an embodiment of the present disclosure.

Exemplarily, FIG. 12 schematically illustrates an example in which the first opening 101 is rectangular. Such structure is not limited. For example, FIG. 13 is a partial structural view of another display panel provided by an embodiment of the present disclosure. Referring to FIG. 13, in a case where each first opening 101 includes a first sub-opening and a second sub-opening which are interconnected with each other, a vertical projection of each signal line 40 on the polarizer 10 may also be provided not to overlap the first opening 101, which may be designed by those skilled in the art according to requirements and is not repeated herein.

Exemplarily, the signal lines 40 may be signal lines for display or test, which is not limited by the embodiment of the present disclosure, and any signal line extending from a fan-out area Q1 can be configured in the above manner.

Figure 14:
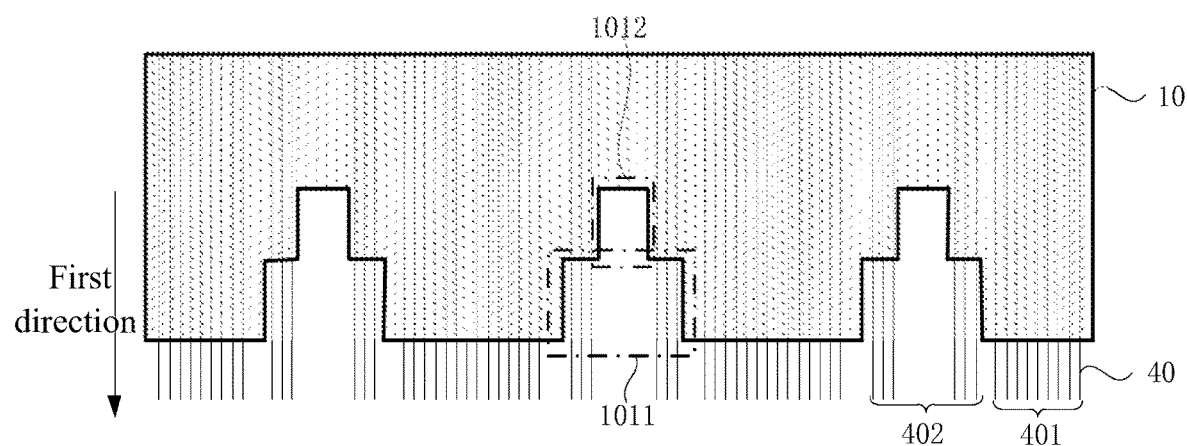
FIG. 14 is a partial structural view of another display panel provided by an embodiment of the present disclosure.

As shown in FIGS. 7, and 9 to 11, in the case where each first opening 101 includes the first opening sub-section 1011 and the second opening sub-section 1012, an edge of the first opening sub-section 1011 is located on the side of the second opening 151 facing away from a display area AA, and an edge of the second opening sub-section 1012 is located on the side of the baffle wall structure 30 facing away from the display area AA, optionally, the vertical projection of each signal line 40 in the first section Q11 on the polarizer 10 does not overlap the second opening sub-section 1012. Referring to FIG. 14, FIG. 14 is a partial structural view of another display panel provided by an embodiment of the present disclosure.

Specifically, in this embodiment, since the edge of the second opening sub-section 1012 is located on the side of the baffle wall structure 30 facing away from the display area AA, the second opening sub-section 1012 may be exposed from the second opening 151 (referring to FIG. 11). Therefore, to reduce the breaking risk of the signal lines 40, the vertical projection of each signal line 40 on the polarizer 10 does not overlap the second opening sub-section 1012. In addition, since the edge of the first opening sub-section 1011 is located on the side of the second opening 151 facing away from the display area AA, the polarizer 10 corresponding to the edge of the first opening sub-section 1011 covers the second opening 151, and thus the signal lines 40 corresponding to this area are protected by the polarizer 10 or the organic planarization layer 15, so that the signal lines 40 can be configured. For the specific principles, reference may be made to the above description, and will not be repeated here.

In addition, in a direction perpendicular to the first direction, a length of the second opening sub-section 1012 is less than a length of the first opening sub-section 1011, and thus in the solution of this embodiment, the arrangement area of the signal lines 40 can be increased, thereby reducing the difficulty in routing, and avoiding the short circuit between the signal lines 40 and other undesirable conditions.

Further referring to FIG. 14, further, multiple signal lines 40 may include display signal lines 401 and test signal lines 402. A vertical projection of each display signal line 401 on the polarizer 10 overlaps the area of the polarizer 10 where no first opening 101 is provided. A vertical projection of each test signal line 402 on the polarizer 10 overlaps the first opening sub-section 1011.

Since the signal lines 40 corresponding to the area of the polarizer 10 where no first opening 101 is provided are protected by the polarizer 10 and the organic planarization layer 15 at the same time, the protection effect is better, and thus the display signal lines 401 can be disposed in this area, thereby effectively reducing the breaking risk of the display signal lines 401, and ensuring the display function of the display panel to be normal. Since the signal lines 40 corresponding to an area of the polarizer 10 where the first openings 101 are provided are protected by the polarizer 10 or the organic planarization layer 15, the protection degree is less than the protection degree in the area where no first opening 101 is provided. Thus, the test signal lines 402 can be provided in this area, and even if the test signal lines 402 are broken, the display function of the display panel cannot be affected.

Figure 15:
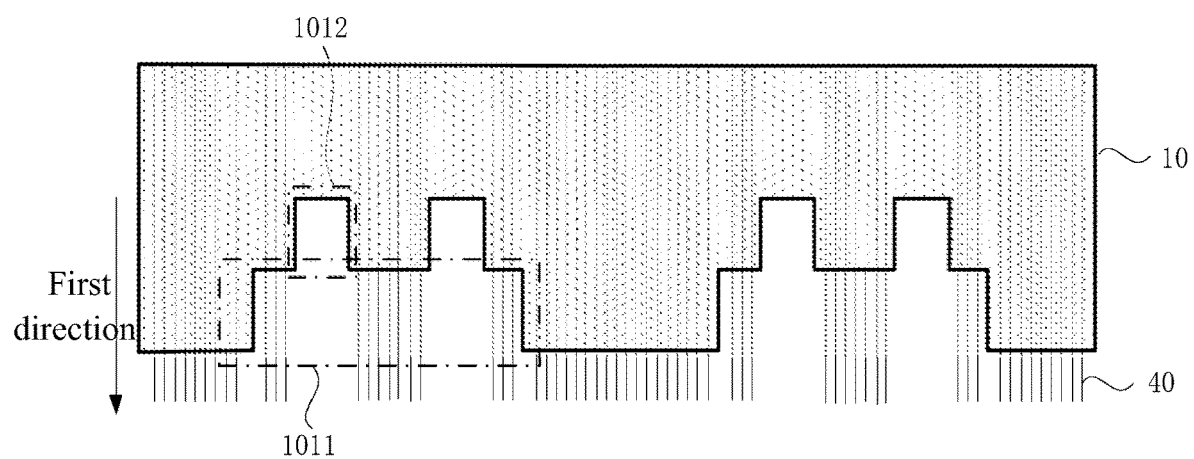
FIG. 15 is a partial structural view of another display panel provided by an embodiment of the present disclosure.

FIG. 15 is a partial structural view of another display panel provided by an embodiment of the present disclosure. Referring to FIG. 15, each first opening sub-section 1011 may communicate with multiple second opening sub-sections 1012. The multiple second opening sub-sections 1012 corresponding to each first opening sub-section 1011 are arranged in a direction perpendicular to the first direction. With such configuration, the arrangement of signal lines 40 may be more uniform, which facilitates reducing the difficulty in routing the signal lines.

In summary, based on the configuration of the first opening 101, the configuration of the traces in the first section Q11 is described in detail in the above embodiments. Based on any one of embodiments in this part, the signal lines 40 at the edge of the polarizer 10 may be parallel to the first direction.

As described above, due to the configuration of the first opening, the area where the signal lines can be disposed at the edge of the polarizer 10 may be reduced. In this embodiment, the signal lines 40 at the edge of the polarizer 10 are provided to be parallel to the first direction so that more signal lines 40 can be disposed in the limited area at the edge of the polarizer.

It is to be noted that the layout of the signal lines in an area other than the area at the side of the polarizer where the first openings are provided may be configured according to the actual requirements, which is not limited by the embodiments of the present disclosure.

Figure 16:
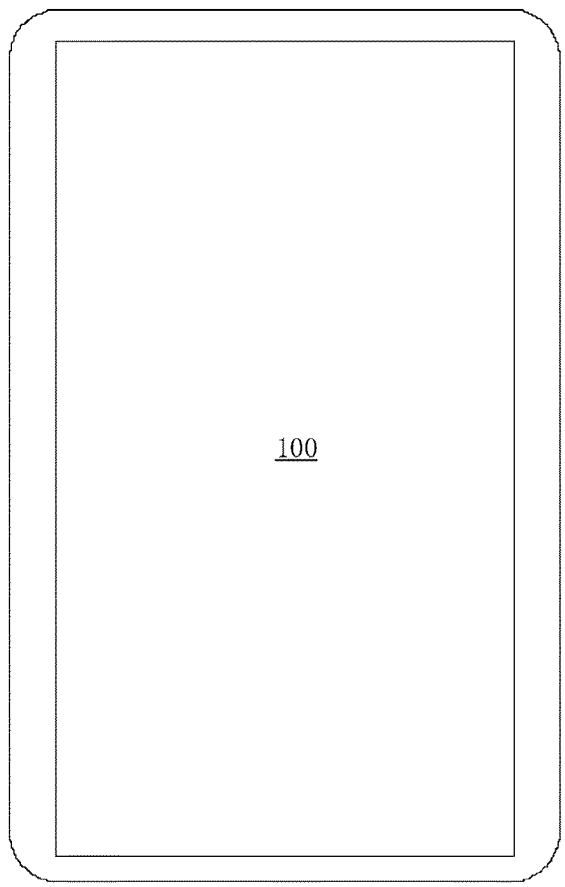
FIG. 16 is a structural view of a display device provided by an embodiment of the present disclosure.

Based on the same concept, the embodiment of the present disclosure also provides a display device. FIG. 16 is a structural view of a display device provided by an embodiment of the present disclosure. The display device 200 includes the display panel 100 of any of the above embodiments, thereby having the same beneficial effects as the above display panel;

similarities may be understood with reference to the above description of the display panel and will not be repeated here. The display device 200 provided by the embodiment of the present disclosure may be a phone shown in FIG. 16, or may be any electronic product with display function, including but not limited to: televisions, laptops, desktop displays, tablet computers, digital cameras, smart bracelets, smart glasses, in-vehicle displays, medical equipment, industry-controlling equipment, touch interactive terminals, and the like, which is not specifically limited by the embodiments of the present disclosure.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
 a display area and a non-display area, wherein the non-display area comprises a fan-out area and a bonding area arranged in a direction facing away from the display area; the fan-out area comprises a first section and a second section; the second section is a bending area; and the first section, the second section and the bonding area are arranged in a first direction; and
 a polarizer, wherein a side of the polarizer facing towards the fan-out area is provided with a plurality of first openings; and the bending area and the bonding area are covered with a protective glue which extends to an edge of the polarizer in the first section.

2. The display panel of claim 1, wherein along the first direction, a longest length of the first opening is d1, and a distance between an edge where no first opening is provided on the side of the polarizer facing towards the fan-out area and a boundary between the first section and the second section is d2, wherein d1+d2≥D, and D is a climbing length of the protective glue.

3. The display panel of claim 1, further comprising a baffle wall structure located in the non-display area, wherein the baffle wall structure is disposed around the display area; and an edge of each of the plurality of first openings is located on a side of the baffle wall structure facing away from the display area.

4. The display panel of claim 1, further comprising:
a substrate;
a pixel circuit layer, an organic planarization layer, a light emitting element layer and an encapsulation layer sequentially located on the substrate, wherein the polarizer is located on a side of the encapsulation layer facing away from the substrate; and the organic planarization layer is provided with a second opening in the first section of the fan-out area; and
a baffle wall structure, wherein the baffle wall structure is located between the encapsulation layer and the pixel circuit layer, and the baffle wall structure is located in the second opening,
wherein an edge of each of the plurality of first openings is located on a side of the second opening facing away from the display area.

5. The display panel of claim 1, wherein at least part of the plurality of first openings each comprises a first opening sub-section and a second opening sub-section; the second opening sub-section is communicated with the first opening sub-section; the second opening sub-section is located on a side of the first opening sub-section facing towards the display area; and in a direction parallel to the display panel and perpendicular to the first direction, a length of the first opening sub-section is larger than a length of the second opening sub-section.

6. The display panel of claim 5, wherein at least one of the first opening sub-section or the second opening sub-section is rectangular or trapezoid.

7. The display panel of claim 5, further comprising:
a substrate;
a pixel circuit layer, an organic planarization layer, a light emitting element layer and an encapsulation layer sequentially located on the substrate, wherein the polarizer is located on a side of the encapsulation layer facing away from the substrate; and the organic planarization layer is provided with a second opening in the first section of the fan-out area; and
a baffle wall structure, wherein the baffle wall structure is located between the encapsulation layer and the pixel circuit layer, and the baffle wall structure is located in the second opening,
wherein an edge of the first opening sub-section is located at a side of the second opening facing away from the display area; and an edge of the second opening sub-section is located on a side of the baffle wall structure facing away from the display area.

8. The display panel of claim 7, wherein the first section is further provided with a plurality of signal lines; and a vertical projection of each of the plurality of signal lines on the polarizer does not overlap the second opening sub-section.

9. The display panel of claim 8, wherein the plurality of signal lines comprise a plurality of display signal lines and a plurality of test signal lines;
a vertical projection of each of the plurality of display signal lines on the polarizer overlaps an area of the polarizer where no first opening is provided; and
a vertical projection of each of the plurality of test signal lines on the polarizer overlaps a corresponding first opening sub-section.

10. The display panel of claim 8, wherein each first opening sub-section correspondingly communicates with a plurality of second opening sub-sections; the plurality of second opening sub-sections corresponding to the each first opening sub-section are arranged in a direction perpendicular to the first direction.

11. The display panel of claim 1, wherein the first section is further provided with a plurality of signal lines; and a vertical projection of each of the plurality of signal lines on the polarizer does not overlap the plurality of first openings.

12. The display panel of claim 8, wherein the plurality of signal lines at the edge of the polarizer are parallel to the first direction.

13. The display panel of claim 1, further comprising a substrate, wherein the substrate comprises a buffer base material layer, a lower adhesive film, and a flexible base material layer which are sequentially laminated; the lower adhesive film is provided with a third opening in the bending area; and the flexible base material layer is located on a side of the lower adhesive film facing towards the polarizer.

14. The display panel of claim 1, wherein a distance between any two adjacent ones of the plurality of first openings is equal.

15. The display panel of claim 9, wherein the plurality of signal lines at the edge of the polarizer are parallel to the first direction.

16. The display panel of claim 10, wherein the plurality of signal lines at the edge of the polarizer are parallel to the first direction.

17. The display panel of claim 11, wherein the plurality of signal lines at the edge of the polarizer are parallel to the first direction.

18. A display device, comprising a display panel, wherein the display panel comprises: a display area and a non-display area, wherein the non-display area comprises a fan-out area and a bonding area arranged in a direction facing away from the display area; the fan-out area comprises a first section and a second section; the second section is a bending area; and the first section, the second section and the bonding area are arranged in a first direction; and a polarizer, wherein a side of the polarizer facing towards the fan-out area is provided with a plurality of first openings; and the bending area and the bonding area are covered with a protective glue which extends to an edge of the polarizer in the first section.

* * * * *